(12) United States Patent
Formenti

(10) Patent No.: US 8,018,236 B2
(45) Date of Patent: Sep. 13, 2011

(54) DEVICE AND METHOD FOR ANALYZING DEFECTS, PARTICULARLY FOR ITEMS MADE OF PLASTICS

(75) Inventor: Claudio Formenti, Curnasco Di Treviolo (IT)

(73) Assignee: SIF S.A.S. di Claudio Formenti E C., Stezzano (IT)

( * ) Notice: Subject to any disclaimer, the term of this patent is extended or adjusted under 35 U.S.C. 154(b) by 205 days.

(21) Appl. No.: 12/379,066

(22) Filed: Feb. 12, 2009

(65) Prior Publication Data

US 2009/0251159 A1 Oct. 8, 2009

(30) Foreign Application Priority Data

Apr. 8, 2008 (IT) .............................. MI2008A0607

(51) Int. Cl.
*H02J 7/16* (2006.01)
*G01R 31/00* (2006.01)
(52) U.S. Cl. .............. 324/522; 324/750.01; 324/755.01; 320/148; 320/149; 264/406

(58) Field of Classification Search .......... 324/500–536, 324/755.01–756.07; 264/406–412; 320/137–165
See application file for complete search history.

(56) References Cited

U.S. PATENT DOCUMENTS 3,543,924 A * 12/1970 Sullivan et al. ............... 209/572
4,677,372 A   6/1987 Meguro et al.
5,510,718 A *  4/1996 Enderby ........................ 324/536

FOREIGN PATENT DOCUMENTS

FR       2 020 290 A      7/1970
WO       WO 95/09351 A    4/1995

* cited by examiner

*Primary Examiner* — Huy Q Phan
*Assistant Examiner* — Emily Chan
(74) *Attorney, Agent, or Firm* — Modiano & Associati; Albert Josif; Daniel O'Byrne

(57) ABSTRACT

A device for analyzing defects, particularly for items made of plastics, such as battery casings and the like, comprising at least one probe, which is adapted to be moved closer to, or to come into contact with, the item made of plastics to be tested, the probe being provided with a plurality of elements to which a high voltage is applied.

10 Claims, 2 Drawing Sheets

DEVICE AND METHOD FOR ANALYZING DEFECTS, PARTICULARLY FOR ITEMS MADE OF PLASTICS

The present invention relates to a device and to a method for analyzing defects, particularly for items made of plastics. More particularly, the invention relates to a device and to a method for analyzing defects that adapts itself particularly to detecting the defects of battery casings.

BACKGROUND OF THE INVENTION

As is known, battery casings, i.e., the containers in which the electrodes that constitute a battery are arranged, must be inspected, after they have been built, in order to check the insulation of their bottom and secondly to check the insulation of the partitions between one cell and another and the insulation with respect to the external walls, and in order to check the shape of the upper edge of the partition, so as to detect any anomalies.

Currently, the bottom of the battery casing is tested by means of an insulation test by applying a high voltage.

Subsequently, in a second testing station, in order to test the rest of the battery casing, i.e., as mentioned, the insulation of the partitions between one cell and another, the insulation that exists with respect to the external walls, the reduction in insulation, the reduction of the edge of the partition, et cetera, a test is carried out by means of a compressed air system that allows to check all the other types of defects that can be present in the battery casing.

This system is scarcely practical, since it forces continuous maintenance in order to replace gaskets that close the system on the product in order to test it, has poor reliability and precision of the result, and forces execution of the test in two steps, with the need therefore to have two testing apparatuses in order to perform the test.

SUMMARY OF THE INVENTION

The aim of the present invention is to provide a device and a method for analyzing defects, particularly for items made of plastics, such as battery casings, that allows to detect the defects of the item with a single apparatus, without the aid of compressed air for searching the defect.

Within this aim, an object of the present invention is to provide a device and a method for analyzing defects that allows repeatability and assurance of the result of the analyses.

Another object of the present invention is to provide a device and a method for analyzing defects that allows to differentiate the type of defect.

Still another object of the present invention is to provide a device and a method for analyzing defects, that allows to reduce testing times.

Another object of the present invention is to provide a device and a method for analyzing defects that are highly reliable, relatively simple to provide and at competitive costs.

This aim, as well as these and other objects that will become better apparent hereinafter, are achieved by a device for analyzing defects, particularly for items made of plastics, such as battery casings and the like, characterized in that it comprises at least one probe, which is adapted to be moved closer to, or to come into contact with, the item made of plastics to be tested, said probe being provided with a plurality of elements to which a high voltage is applied.

This aim is also achieved by a method characterized in that it comprises the steps of:

moving an item made of plastics to be tested along a conveyance line;

reaching, on the part of said item, a testing station;

moving closer, or moving into contact, at least one probe element with the item made of plastics to be tested;

applying a high voltage to said probe, switching it in order to obtain a potential difference that is suitable to detect the defects of said item made of plastics, and adjusting said voltage during the testing step so as to differentiate the defects.

BRIEF DESCRIPTION OF THE DRAWINGS

Further characteristics and advantages of the device and method according to the present invention will become better apparent from the description of a preferred but not exclusive embodiment thereof, illustrated by way of non-limiting example in the accompanying drawings, wherein.

DESCRIPTION OF THE PREFERRED EMBODIMENTS

Figure 1:
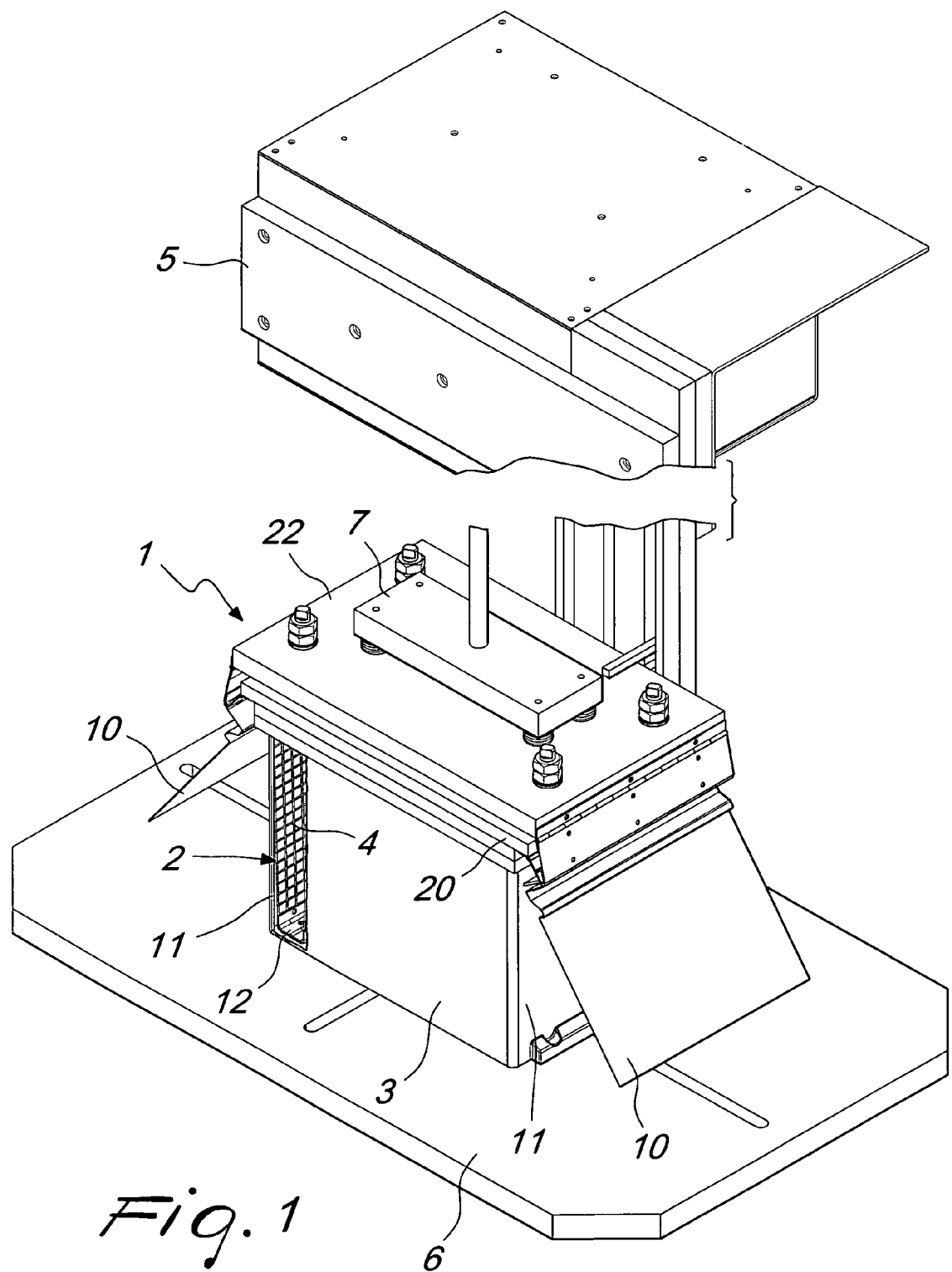
FIG. 1 is a perspective view of the device according to the present invention, applied to a battery casing.
Figure 2:
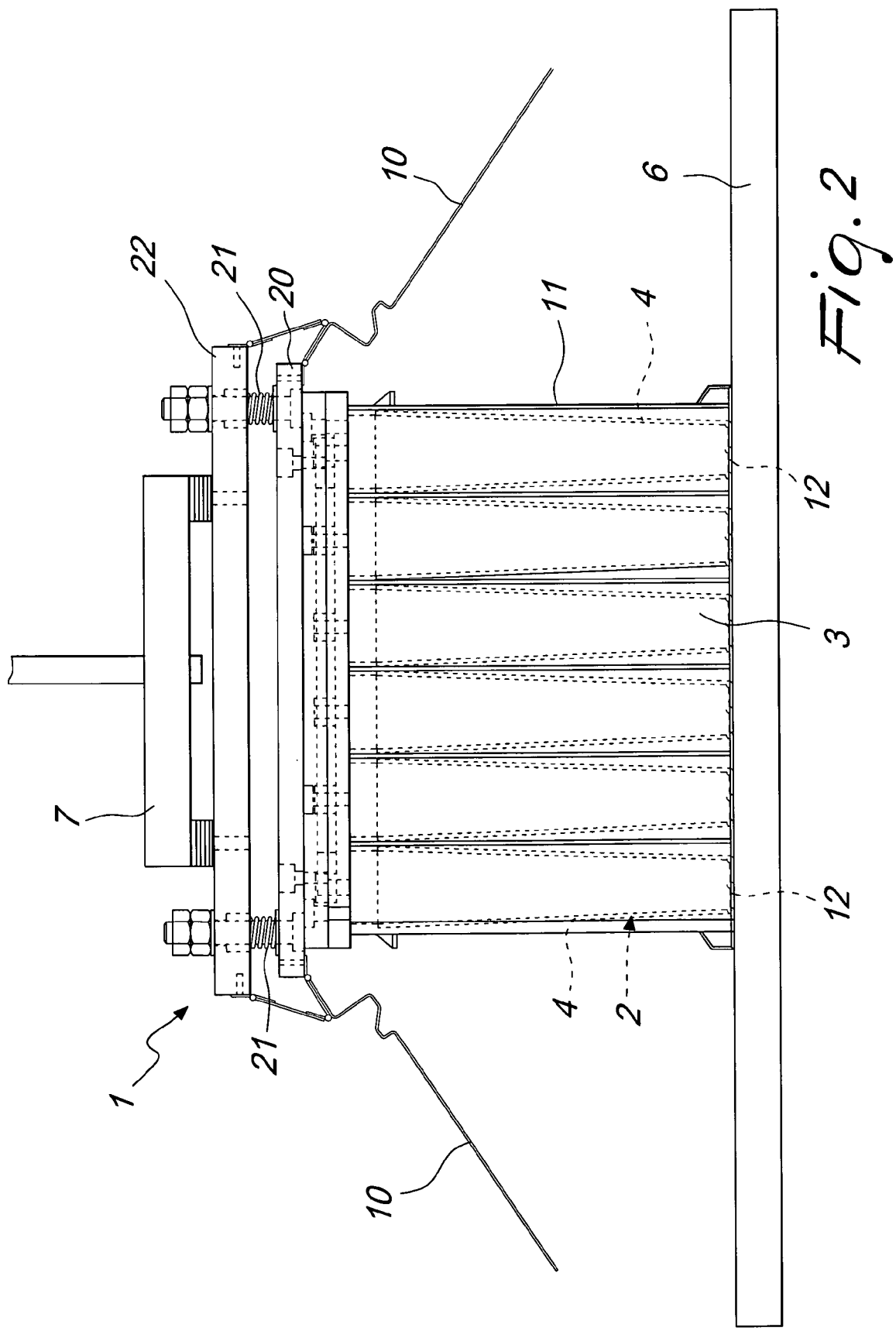
FIG. 2 is a side elevation view of the device according to the present invention, applied to a battery casing.

With reference to the figures, the device according to the present invention, generally designated by the reference numeral 1, comprises at least one probe 2, which is adapted to be moved closer to, or to come into contact with, an item made of plastics to be tested. For example, the probe can be inserted, by means of a robotic arm 7, in a battery casing 3, in order to verify the presence or absence of defects in said casing, i.e., for example, check the insulation of the bottom, the insulation of the partitions between one cell and the other of the battery casing, the insulation with respect to the external walls, the reduction in insulation, the reduction of the edge of the partition, i.e., irregularities of the upper edge of the partition.

The device according to the present invention comprises a first plate-like element 20, which is connected by way of elastic means, such as for example springs 21, to a second plate-like element 22. The two plate-like elements, made of insulating material, support, by means of a hinge-like pivoting, two contoured lateral metallic plates 10, which come into contact with the outer side wall 11 of the battery casing 3; the lateral metal plates are connected to the ground.

The probe 2 proper comprises a U-shaped grid 4, which has, on its lower part, hinge means 12 (preferably of the triple hinge type) which, by coming into contact with the bottom of the battery casing 3, allow to make said grid adhere to the bottom and at the same time to move the U-shaped grid toward the internal walls of the battery casing 3.

The U-shaped grid 4 of each individual cell is connected to a high voltage generation apparatus, schematically designated by the reference numeral 5, which allows to apply a high voltage to the grid 4, which will rest against the bottom of the battery casing 3.

Within the high voltage generation apparatus 5 a high voltage switching system is provided that allows, during the test cycle, to connect the U-shaped grids 4 first to the high voltage, in order to check insulation with respect to the bottom and the side walls, and then to alternately connect one grid 4 to the high voltage and one grid to the ground, in order to check for defects between the partitions of the battery casing 3.

The probe system is moved by means of a robotic arm 7 in order to be inserted within the battery casing 3. The movement causes the first insulating plate-like element 20, on which the several probes 2 are fixed and appropriately connected one another, to rest appropriately in the battery casing 3, before the robotic arm 7 reaches the final stroke, and then also the second insulating plate-like element 22, connected mechanically to the first plate by the adjustable elastic means 21, so as to rest almost completely on the first plate.

These elastic means 21 allows simultaneously to move also the lateral metallic plates 10, which are pivoted to the first and second plate-like elements.

This spring-loaded movement also allows adaptation to the height differences of the battery casing 3.

This spring-loaded movement also allows movement.

In order to check the insulation in the bottom of the battery casing 3, the battery casing is rested on a metal plate 6.

If lack of insulation of the battery casing 3 is observed, it is detected and reported by the apparatus 5 for generating voltage, detecting defects and performing a check.

At this point in time, a sequence of test steps occurs which detect defects of the bottom of the battery casing, defects of the side walls of the casing, defects of the partition between one cell and another of the casing, the reduction in insulation of the partition between one cell and another, even if the partition is not perforated, detection of any reduction of the upper edge of the partition, and detection of any impurities within the partition.

The high voltage applied to the probe must be switched both to test the partitions, and thus achieve from one side of the partition to the other the potential difference that is suitable to detect defects, and to test the edges and bottom of the battery casing.

Another peculiarity of the test that can be carried out according to the invention is the adjustment of voltage during the test. Indeed, in order to search for defects of the partition it is necessary to act by increasing the test voltage during the test so as to differentiate defects, but most of all to prevent the test voltage, in the case for example of the reduction of the upper edge of the partition, from being discharged onto the complementary electrode or onto the grounds and instead not corresponding to an actual defect.

The probes are provided in such a manner that they come closer to, or come into contact with, the material in order to resolve the geometries of the products and allow effective management of the test.

Therefore, the method according to the invention is as follows:

first of all, the battery casing, or another item made of plastics, is moved along a conveyance line or on a transfer unit and reaches the testing station.

At this point in time, the probe 2, conveniently designed so as to solve the problems of the test, is introduced for example in a battery by means of a mechanical arm.

The probe then arranges itself appropriately within the battery casing and at this point the test steps sequence will occur and allow to check the bottom of the casing, the side walls of the casing, the partition between one cell of the casing and another, the reduction in insulation between one cell and another even if the partition is not perforated, the reduction of the upper edge of the partition and the presence of impurities in that partition.

In order to check the partitions, the high voltage is switched in order to obtain a difference in potential that is suitable to detect the defects of the partitions and test the edges of the bottom of the battery casing.

The voltage during the test can also be adjusted by varying it, so as to differentiate the defects but also to prevent the test voltage from not corresponding to an actual defect.

In practice it has been found that the device and the method according to the invention fully achieve the intended aim and objects, since they allowed to test items made of plastics, such as for example battery casings, without using compressed air, in order to detect defects thereof in insulation, holes or other defects.

The device and the method thus conceived are susceptible of numerous modifications and variations, all of which are within the scope of the appended claims; all the details may further be replaced with other technically equivalent elements.

In practice, the materials used, as well as the contingent shapes and dimensions, may be any according to requirements and to the state of the art.

The disclosures in Italian Patent Application No. MI2008A000607 from which this application claims priority are incorporated herein by reference.

What is claimed is:

1. A device for analyzing defects of, battery casings made of plastic material, comprising at least one probe system, which is adapted to be inserted into the battery casing made of plastics to be tested, wherein said probe system is provided with a plurality of U-shaped grids (4) having hinge means (12) to which a high voltage is applied; said device further comprising two contoured lateral metallic plates which come into contact with an outer side wall of the battery casing made of plastic material to be tested.

2. The device according to claim 1, wherein said probe has a geometry that allows to come closer to, or come into contact with, the item made of plastics to be tested.

3. The device according to claim 1, further comprising a first plate-like element and a second plate-like element, which are connected one another by elastic means, and two lateral metal plates, which are pivoted to said first and second plate-like elements and are adapted to come into contact with the lateral outer portion of the battery casing, said lateral plates being connected to the ground.

4. The device according to claim 3, wherein said U-shaped grids are connected to said first plate-like element and are adapted to be inserted in said battery casing.

5. The device according to claim 4, wherein each of said grids is provided in a lower region with said hinge means, which by coming into contact with the bottom of the battery casing allow to make said grid adhere to the bottom and at the same time allow to move the U-shaped grid toward the walls of the battery casing.

6. A method for analyzing defects of battery casings made of plastic material, comprising the steps of:

moving an item made of plastics to be tested along a conveyance line;

reaching, on the part of said item, a testing station;

inserting at least one probe system into the battery casing made of plastics to be tested, wherein said probe system is provided with a plurality of a U-shaped grid (4) having hinge means (12) to which a high voltage is applied; said device further comprising two contoured lateral metallic plates which come into contact with an outer side wall of the battery casing made of plastic material to be tested;

applying a high voltage to said probe, switching it in order to obtain a potential difference that is suitable to detect defects of said battery casing made of plastics, and adjusting said voltage during the testing step so as to differentiate the defects.

7. A device for analyzing defects of battery casings made of plastic material, comprising at least one probe, which is adapted to be moved closer to, or to come into contact with, the battery casing made of plastic material to be tested, said probe being provided with a plurality of elements to which a high voltage is applied, the device further comprising a first plate-like element and a second plate-like element, which are connected one another by elastic means, and two lateral metal plates, which are pivoted to said first and second plate-like elements and are adapted to come into contact with the lateral outer portion of the battery casing, said lateral plates being connected to the ground.

8. The device according to claim 7, wherein said probe has a geometry that allows to come closer to, or come into contact with, the battery casing made of plastic material to be tested.

9. The device according to claim 7, further comprising at least one U-shaped grid, which is connected to said first plate-like element and is adapted to be inserted in a cell of said battery casing.

10. The device according to claim 9, wherein said grid is provided in a lower region with hinge means, which by coming into contact with the bottom of the battery casing allow to make said grid adhere to the bottom and at the same time allow to move the U-shaped grid toward the walls of the battery casing.

* * * * *